(12) United States Patent
Osada et al.

(10) Patent No.: US 8,404,335 B2
(45) Date of Patent: *Mar. 26, 2013

(54) LAMINATED FILM AND MOLDED BODY

(75) Inventors: Syunichi Osada, Shiga (JP); Wataru Gouda, Shiga (JP)

(73) Assignee: Toray Industries, Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/342,284

(22) Filed: Jan. 3, 2012

(65) Prior Publication Data

US 2012/0097427 A1 Apr. 26, 2012

Related U.S. Application Data

(62) Division of application No. 11/990,608, filed as application No. PCT/JP2006/315794 on Aug. 10, 2006, now Pat. No. 8,110,282.

(30) Foreign Application Priority Data

Aug. 18, 2005 (JP) ................................ 2005-237497

(51) Int. Cl.
*B32B 7/00* (2006.01)
*B32B 27/06* (2006.01)
*B32B 27/08* (2006.01)

(52) U.S. Cl. ........ 428/216; 428/212; 428/213; 428/480; 359/577; 359/582; 359/584; 359/589; 528/298; 528/307; 528/308; 528/308.6

(58) Field of Classification Search .................. None
See application file for complete search history.

(56) References Cited

U.S. PATENT DOCUMENTS

| | | | |
|---|---|---|---|
| 3,711,176 A | | 1/1973 | Alfrey et al. |
| 4,310,584 A | | 1/1982 | Cooper et al. |
| 4,937,134 A | * | 6/1990 | Schrenk et al. ............... 428/213 |
| 4,950,771 A | * | 8/1990 | Masumoto et al. ........... 549/335 |
| 5,089,318 A | | 2/1992 | Shetty et al. |
| 5,095,210 A | | 3/1992 | Wheatley et al. |
| 5,122,905 A | | 6/1992 | Wheatley et al. |
| 5,126,880 A | | 6/1992 | Wheatley et al. |
| 5,149,578 A | | 9/1992 | Wheatley et al. |
| 5,339,198 A | | 8/1994 | Wheatly et al. |
| 5,427,842 A | | 6/1995 | Bland et al. |
| 5,486,949 A | | 1/1996 | Schrenk et al. |
| 5,612,820 A | | 3/1997 | Schrenk et al. |
| 5,783,283 A | | 7/1998 | Klein et al. |
| 5,882,774 A | * | 3/1999 | Jonza et al. ................... 428/212 |
| 5,968,666 A | * | 10/1999 | Carter et al. .................. 428/480 |
| 6,040,061 A | | 3/2000 | Bland et al. |
| 6,045,894 A | | 4/2000 | Jonza et al. |
| 6,280,845 B1 | * | 8/2001 | Kollaja et al. ............. 428/411.1 |
| 6,447,859 B2 | | 9/2002 | Oguro et al. |

(Continued)

FOREIGN PATENT DOCUMENTS

| | | |
|---|---|---|
| GB | 2 066 155 A | 7/1981 |
| JP | 56-99307 A | 8/1981 |

(Continued)

*Primary Examiner* — Vivan Chen
(74) *Attorney, Agent, or Firm* — DLA Piper LLP (US)

(57) ABSTRACT

A laminated film includes a structure where each 200 layers or more of a layer composed of a resin A (A layer) and a layer composed of a resin B (B layer) are alternately laminated, wherein a relative reflectance in a wavelength range of 400 nm to 1000 nm is 30% or more, tensile stresses at 100% elongation in a longitudinal direction and a width direction of the film are 3 MPa or more and 90 MPa or less in a tensile test at 150° C., and the number of layers with a layer pair-thickness of 120 nm or more and less than 220 nm is 1.05 times or more to 2.5 times or less the number of layers with a layer-thickness of 220 nm or more and 320 nm or less.

12 Claims, 6 Drawing Sheets

U.S. PATENT DOCUMENTS

| | | |
|---|---|---|
| 6,459,514 B2 | 10/2002 | Gilbert et al. |
| 6,475,608 B2 | 11/2002 | Allen et al. |
| 6,641,900 B2 * | 11/2003 | Hebrink et al. ............... 428/212 |
| 7,538,176 B2 | 5/2009 | Fuji et al. |
| 8,110,282 B2 * | 2/2012 | Osada et al. ................ 428/216 |
| 2002/0062919 A1 * | 5/2002 | Oxman et al. ............ 156/275.5 |
| 2005/0171326 A1 | 8/2005 | Edwards et al. |
| 2010/0323159 A1 | 12/2010 | Osada et al. |
| 2010/0330350 A1 * | 12/2010 | Osada et al. ................ 428/213 |

FOREIGN PATENT DOCUMENTS

| | | |
|---|---|---|
| JP | 3-41401 A | 2/1991 |
| JP | 4-295804 A | 10/1992 |
| JP | 5-193040 A | 8/1993 |
| JP | 6-190995 A | 7/1994 |
| JP | 6-190997 A | 7/1994 |
| JP | 6-234868 A | 8/1994 |
| JP | 08-104742 | 4/1996 |
| JP | 9-506837 T | 7/1997 |
| JP | 10-76620 A | 3/1998 |
| JP | 10-193539 A | 7/1998 |
| JP | 11-228577 | 8/1999 |
| JP | 2002-509043 T | 3/2002 |
| JP | 2003-11279 A | 1/2003 |

* cited by examiner

Fig. 4
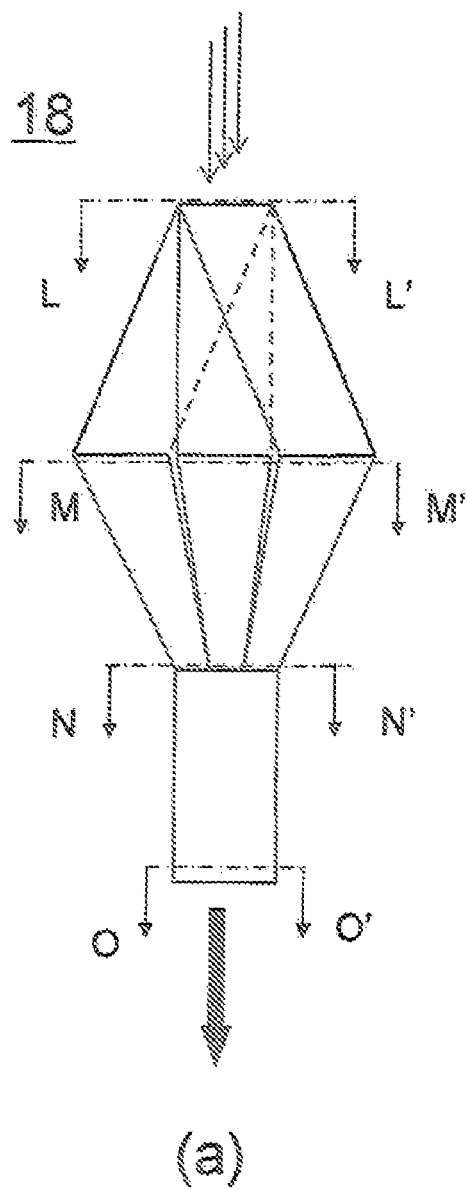
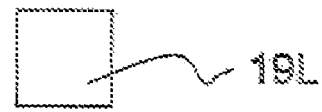
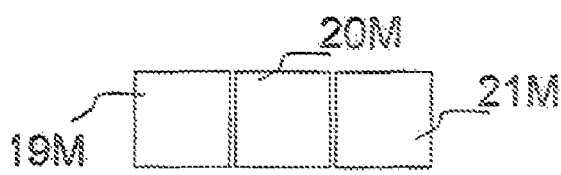
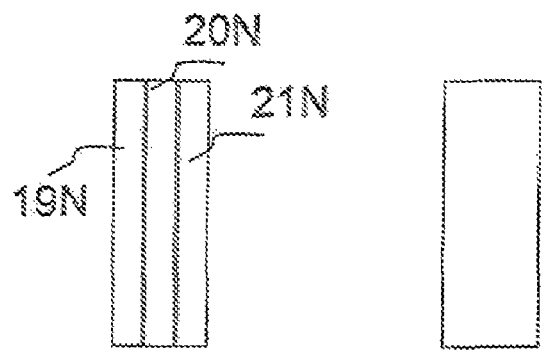

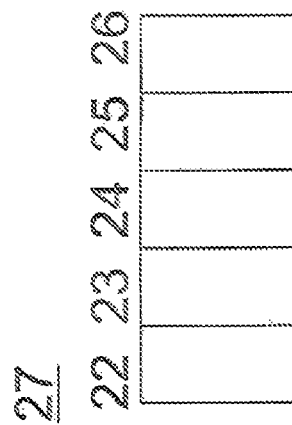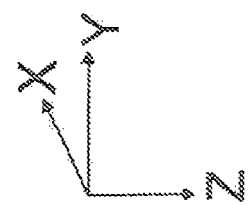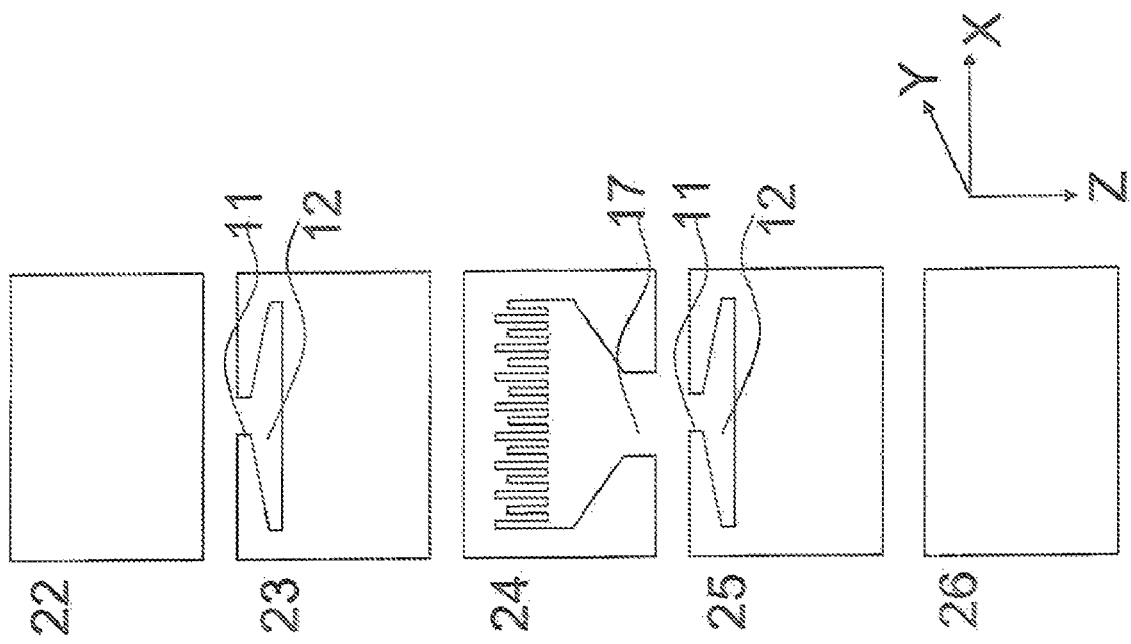

LAMINATED FILM AND MOLDED BODY

RELATED APPLICATIONS

This is a divisional of U.S. Ser. No. 11/990,608, filed Feb. 15, 2008, U.S. Pat. No. 8,110,282, which is a §371 of International Application No. PCT/JP2006/315794, with an international filing date of Aug. 10, 2006 (WO 2007/020861 A1, published Feb. 22, 2007), which is based on Japanese Patent Application No. 2005-237497, filed Aug. 18, 2005.

TECHNICAL FIELD

This disclosure relates to a laminated film in which layers made from at least two kinds of resins are laminated, and a molded body made from the laminated film.

BACKGROUND

In various products (components) such as household electric appliances and building members as well as decorative components related to automobiles, to enhance the designing property, those variously decorated in wood-effect, fabric-effect, metal-effect and the like have been used, and a metal-effect appearance with a high brightness have come to be desired in recent years.

As a technique for providing a metal-effect to various molded components, the technique most commonly used is coating. Although coating can provide various designs and functions to a product, it often uses an organic solvent, giving a large influence on environments. Further, there are instances that recycling is not easy due to a coated film, and presence of a coating process has recently been regarded as a problem in increasing concerns to environmental problems in recent years.

As other techniques to provide a metal-effect, there are plating, vapor deposition and the like. There is also a problem that recycling is difficult due to a metal layer in the case of plating and vapor deposition, and particularly in the case of plating, the influence on environments by heavy metals is large, thus its alternatives are being desired strongly. Further, in the case of plating and vapor deposition, an electromagnetic shielding property occurs resulting from the metal layer, and there are instances that an electromagnetic interference takes place when used as a decorative material in an automobile or a cellular phone, posing a problem.

Meanwhile, various multi-layer films in which thermoplastic resins are laminated have been proposed, and for example, those that can markedly prevent glass from breaking and flying apart by sticking a multi-layer laminated film having excellent tear resistance onto a glass surface are being utilized (for example, see Japanese Unexamined Patent Publication Hei 6-190995 (1994), Japanese Unexamined Patent Publication Hei 6-190997 (1994) and Japanese Unexamined Patent Publication Hei 10-76620 (1998).

Further, by alternately laminating resin layers having different refractive indexes in multi-layers, there exist films selectively reflecting a specific wavelength (for example, see Japanese Unexamined Patent Publication Hei 3-41401 (1991), Japanese Unexamined Patent Publication Hei 4-295804 (1992) and Japanese Unexamined Patent Publication Hei 9-506837 (1997). Among these, a film selectively reflecting a specific wavelength acts as a filter transmitting or reflecting specific light, and is used as a film for a backlight in a liquid crystal display.

This film selectively reflecting light with a specific wavelength can have a metal-effect by setting its reflection band in visible light. However, the conventional laminated film selectively reflecting light with a specific wavelength was insufficient in formability. Hence, it was difficult to form a desired shape even by conducting forming such as vacuum forming, vacuum-pneumatic forming, plug-assisted vacuum-pneumatic forming, in mold forming, insert molding, or draw forming. Further, since a part stretched by the forming becomes thin, there is a problem that color change occurs, resulting in deterioration of the metal-effect. Furthermore, there is a problem that a part stretched is very easily delaminated. Moreover, there is also a problem that the conventional film looks colored because it is unsuitable in reflecting characteristics. That is, no conventional technique has satisfied all the following conditions:

1) a metal-effect material transmitting an electromagnetic wave,
2) a material capable of forming without color change after forming and hardly causing delamination,
3) a material without coloring and with a natural metal-effect appearance.

It could therefore be helpful to provide, in view of the above-described problems of the conventional art, a film transmitting an electromagnetic wave, having a high brightness and a natural metal-effect, and also having excellent formability, causing no delamination and maintaining the metal-effect after forming. It could also be helpful to provide a molded body having less environmental burden, excellent in recycling efficiency and giving no electromagnetic interference.

SUMMARY

We thus provide a laminated film including a structure where each 30 layers or more of a layer composed of a resin A (A layer) and a layer composed of a resin B (B layer) are alternately laminated, wherein a relative reflectance in a wavelength range of 400 nm to 1000 nm is 30% or more, tensile stresses at 100% elongation in a longitudinal direction and a width direction of the film are 3 MPa or more and 90 MPa or less in a tensile test at 150° C., and the number of layers with a layer-pair thickness of 10 nm or more and less than 220 nm is more than the number of layers with a layer-pair thickness of 220 nm or more and 320 nm or less.

The laminated film has a high brightness and a natural metal-effect, and also has excellent formability, causes no delamination and maintains the metal-effect after forming.

Further, adjustment of the color shade of the metal-effect becomes easy by setting the average transmittance in a wavelength range of 400 nm to 1000 nm to 4% or more and 55% or less.

Further, by setting the dynamic friction coefficient of the laminated film to 0.5 or less, it is possible to further improve formability in vacuum forming, vacuum-pneumatic forming, plug-assisted vacuum-pneumatic forming, in mold forming, insert molding or the like.

Further, by setting an absolute value of a difference of SP values between a resin A and a resin B 1.0 or less, it is possible to cause less delamination after forming.

Further, the molded body including the laminated film is excellent in recycle efficiency and does not generate electromagnetic interference.

BRIEF DESCRIPTION OF THE DRAWINGS

FIGS. 4(a-e) collectively show several schematic and sectional views of a converging apparatus.

FIG. 6 is a feed block (laminating apparatus).

DESCRIPTION OF THE REFERENCE NUMERALS

Figure 1:
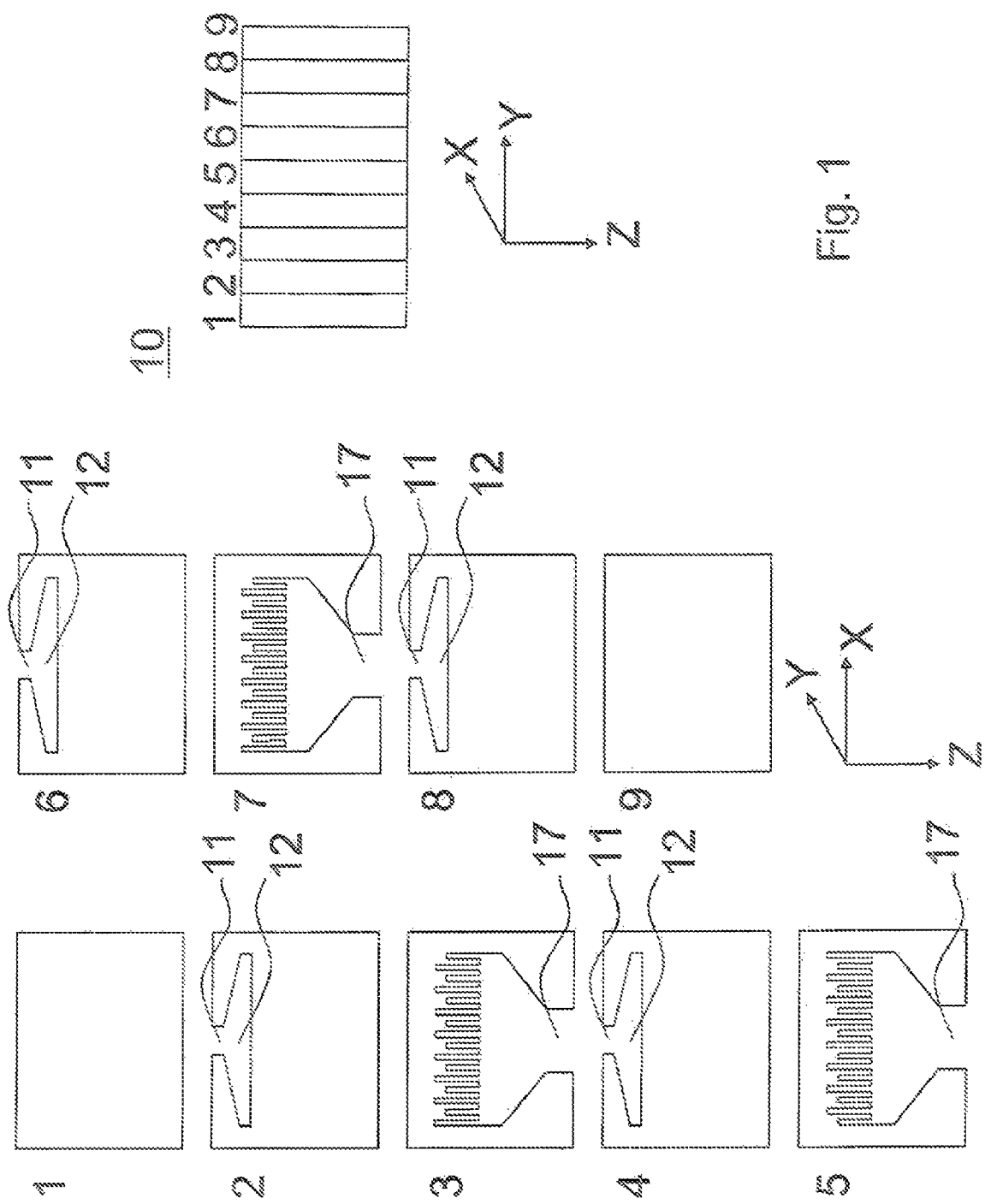
FIG. 1 is a laminating apparatus and components thereof.
Figure 2:
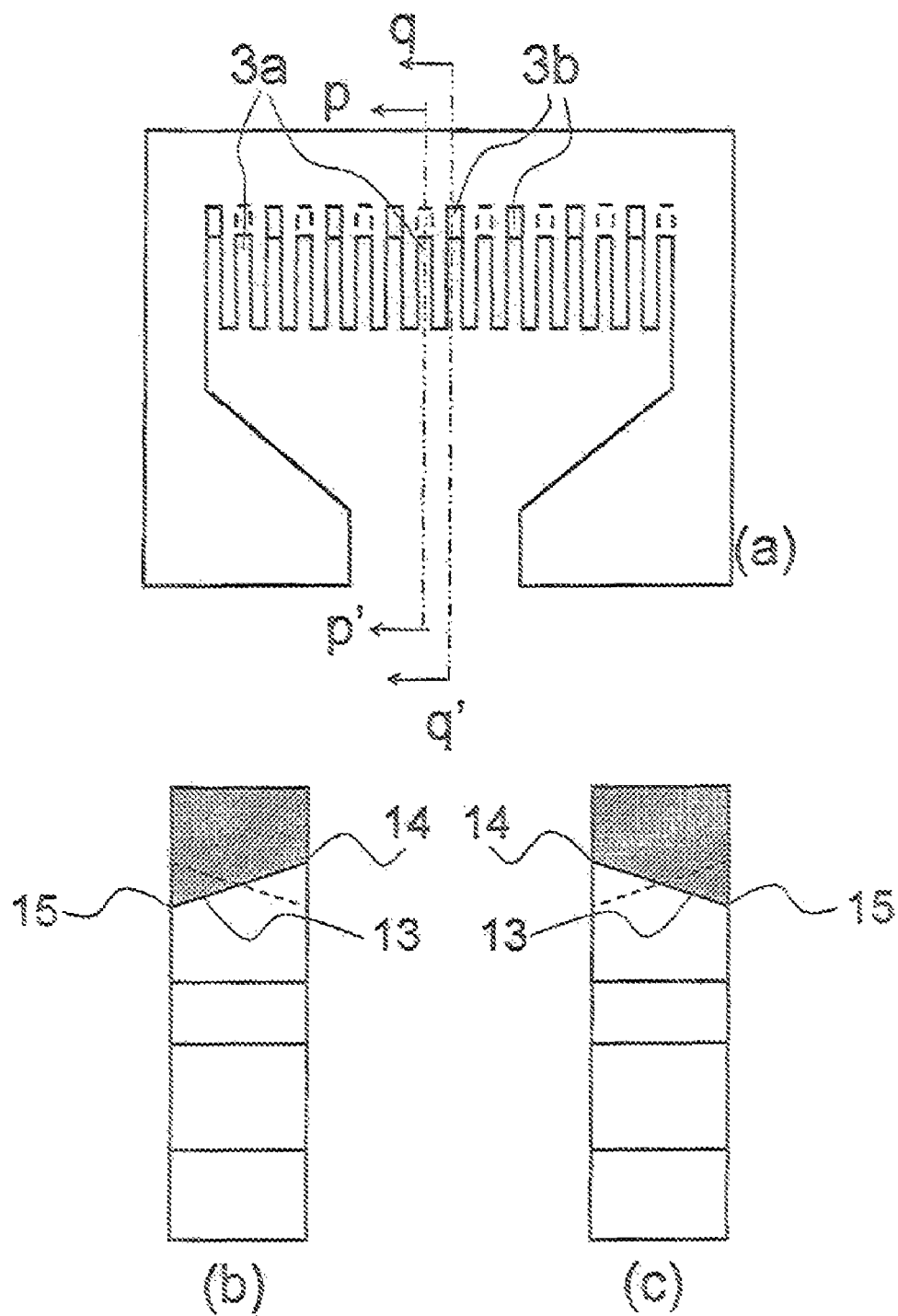
FIGS. 2(a-c) collectively show several schematic and sectional views of a slit part.

| | |
|---|---|
| 1: | Side panel |
| 2: | Feed part of resin A |
| 3: | Slit part |
| 3a, 3b: | Slit |
| 4: | Feed part of resin B |
| 5: | Slit part |
| 6: | Feed part of resin A |
| 7: | Slit part |
| 8: | Feed part of resin B |
| 9: | Side panel |
| 10: | Laminating apparatus, |
| 11: | Feed port |
| 12: | Liquid pooling part |
| 18: | Converging apparatus |
| 22: | Side panel |
| 23: | Feed part of resin A |
| 24: | Slit part |
| 25: | Feed part of resin B |
| 26: | Side panel |
| 27: | Feed block (laminating apparatus) and components thereof |

DETAILED DESCRIPTION

The laminated film must include a structure where each 30 layers or more of a layer composed of a resin A (A layer) and a layer composed of a resin B (B layer) are alternately laminated, wherein a relative reflectance in a wavelength range of 400 nm to 1000 nm is 30% or more, tensile stresses at 100% elongation in a longitudinal direction and a width direction of the film are 3 MPa or more and 90 MPa or less in a tensile test at 150° C., and the number of layers with a layer-pair thickness of 1.0 nm or more and less than 220 nm is more than the number of layers with a layer-pair thickness of 220 nm or more and 320 nm or less. Such film has a high brightness and a natural metal-effect, and excellent formability, causes no delamination and maintains the metal-effect after forming. Further, since the laminated film is composed of polymers, it becomes a metal-effect film transmitting an electromagnetic wave. The electromagnetic wave refers to a part of infrared light and one whose frequency is 3 Hz to 3 THz.

The resin may be a thermoplastic resin or a thermosetting resin, may be a homoresin, a copolymer resin or a blend of 2 or more kinds. More preferably, it is a thermoplastic resin because of good formability. Further, in each resin, various additives may be added, for example, an antioxidant, an antistatic agent, a crystalline nucleating agent, an inorganic particle, an organic particle, a viscosity reducing agent, a heat stabilizer, a lubricant, an infrared absorber, an ultraviolet absorber, and a doping agent for adjusting refractive index.

Examples of the resin include polyolefin resins such as polyethylene, polypropylene, polystyrene and polymethylpentene; alicyclic polyolefin resins; polyamide resins such as nylon 6 and nylon 66; aramid resins; polyester resins such as polyethylene terephthalate, polybutylene terephthalate, polypropylene terephthalate, polybutyl succinate and polyethylene 2,6-naphthalate; polycarbonate resins, polyalylate resins, polyacetal resins, polyphenylene sulfide resins, fluorine resins such as ethylene tetrafluoride resin, ethylene trifluoride resin, ethylene trifluoride chloride resin, ethylene tetrafluoride-propylene hexafluoride copolymer and vinylidene fluoride resin; acryl resins, methacryl resins, polyacetal resins, polyglycolic acid resins and polylactic acid resins. Among these, from the viewpoints of strength, heat resistance and transparency, polyester is particularly preferable.

The polyester means a homopolyester or a copolyester which is a polycondensate of a dicarboxylic acid component skeleton with a diol component skeleton. As the homopolyester, for example, typical ones include polyethylene terephthalate, polypropylene terephthalate, polybutylene terephthalate, polyethylene-2,6-naphthalate, poly(1,4-cyclohexane dimethylene terephthalate) and polyethylene diphenylate. In particular, polyethylene terephthalate can be preferably used in very broad applications because it is cheap.

Further, the copolyester is defined as a polycondensate composed of at least 3 components selected from components having a dicarboxylic acid skeleton and components having a diol skeleton listed below. Examples of the component having a dicarboxylic acid skeleton include terephthalic acid, isophthalic acid, phthalic acid, 1,4-naphthalenedicarboxylic acid, 1,5-naphthalenedicarboxylic acid, 2,6-naphthalenedicarboxylic acid, 4,4'-diphenyldicarboxylic acid, 4,4'-diphenylsulfonedicarboxylic acid, adipic acid, sebacic acid, dimer acid, cyclohexanedicarboxylic acid and ester derivatives thereof. Examples of the component having a glycol skeleton include ethylene glycol, 1,2-propanediol, 1,3-butanediol, 1,4-butanediol, 1,5-pentadiol, diethylene glycol, polyalkylene glycol, 2,2-bis(4'-β-hydroxyethoxyphenyl)propane, isosorbate, 1,4-cyclohexanedimethanol and spirogylcol.

Further, regarding the A layer and the B layer, an average in-plane refractive index of the A layer is relatively higher than that of the B layer. Further, the difference between the average in-plane refractive index of the A layer and the average in-plane refractive index of the B layer is preferably 0.03 or more. It is more preferably 0.05 or more, and further preferably 0.1 or more. When the difference of refractive indexes is less than 0.03, a sufficient reflectance cannot be obtained, which is not preferable. Further, when the difference between the average in-plane refractive index and the refractive index in the thickness direction of the A layer is 0.03 or more and the difference between the average in-plane refractive index and the refractive index in the thickness direction of the B layer is 0.03 or less, it is more preferable because lowering of the reflectance at a reflection peak does not occur even when an incident angle becomes large.

As a preferable combination of the resin A and the resin B, it is primarily preferable that an absolute value of the difference of SP values between the resin A and the resin B is 1.0 or less. When an absolute value of the difference of SP values is 1.0 or less, delamination hardly occurs. More preferably, it is preferable to have a layer composed of the resin A and a layer composed of the resin B with the same basic skeleton as the resin A. The basic skeleton is a repeating unit constituting a resin and, for example, when one of the resins is polyethylene terephthalate, ethylene terephthalate is a basic skeleton. Further, as another example, when one of the resins is polyethylene, ethylene is a basic skeleton. When the resin A and the resin B include the same basic skeleton, detachment between layers further hardly occurs.

As a preferable combination of the resin A and the resin B, it is secondly preferable that the difference of glass transition temperatures between the resin A and the resin B is 20° C. or less. When the difference of glass transition temperatures is more than 20° C., thickness uniformity becomes poor in forming a laminated film, and appearance of metallic luster becomes poor. Further, there is a tendency to cause a problem that over-stretching takes place in forming a laminated film.

Further, it is preferable that the resin A is polyethylene terephthalate or polyethylene naphthalate, and the resin B is a polyester containing spiroglycol. The polyester containing spiroglycol means a copolyester copolymerized with spiroglycol, or a homopolyester, or a polyester in which these are blended. Since the polyester containing spiroglycol has a small difference of glass transition temperatures from polyethylene terephthalate or polyethylene naphthalate, it is preferable because over-stretching does not tend to take place in forming and delamination does not tend to take place as well. More preferably, it is preferable that the resin A is polyethylene terephthalate or polyethylene naphthalate, and the resin B is a polyester containing spiroglycol and cyclohexanedicarboxylic acid. When the resin B is a polyester containing spiroglycol and cyclohexanedicarboxylic acid, a high reflectance is easily obtained because it has a large difference of in-plane refractive indexes from polyethylene terephthalate or polyethylene naphthalate. Further, it has a small difference of glass transition temperatures from polyethylene terephthalate or polyethylene naphthalate, and it has excellent adhesiveness so that over-stretching does not tend to take place in forming and delamination does not also tend to take place.

Further, it is preferable that the resin A is polyethylene terephthalate or polyethylene naphthalate, and the resin B is a polyester containing cyclohexanedimethanol. The polyester containing cyclohexanedimethanol means a copolyester copolymerized with cyclohexanedimethanol, or a homopolyester, or a polyester in which these are blended. The polyester containing cyclohexanedimethanol has a small difference of glass transition temperatures from polyethylene terephthalate or polyethylene naphthalate, thus it is preferable because over-stretching does not tend to take place in forming and delamination does not tend to take place as well. More preferably, the resin B is a polycondensate of ethylene terephthalate where the copolymerized amount of cyclohexanedimethanol is 15 mol % or more and 60 mol % or less. By doing so, together with high reflective performance, the change of optical properties is small particularly in heating or with time, and the detachment between layers does not also tend to take place. A polycondensate of ethylene terephthalate where the copolymerized amount of cyclohexanedimethanol is 15 mol % or more and 60 mol % or less adheres very strongly to polyethylene terephthalate. Further, there are cis and trans configurations in the cyclohexanedimethanol group as geometrical isomers, and there are chair and boat forms as conformational isomers, thus orientational crystallization does not easily occurs in co-stretching with polyethylene terephthalate, it has a high reflectance, the change of optical properties by thermal history is further small, and also break does not tend to take place in forming a film.

Inclusion of a structure where a layer composed of a resin A (A layer) and a layer composed of a resin B (B layer) are alternately laminated is defined as presence of a part having a structure where the A layer and the B layer are alternately laminated in a thickness direction. That is, the order of arrangement in a thickness direction of the A layer and the B layer is preferably not random, and from a third layer on other than the A layer and the B layer, the order of its arrangement is not particularly limited. Further, in the case where there are an A layer, a B layer and a C layer composed of a resin C, it is preferable that these layers are laminated in a regular arrangement such as A(BCA)n, A(BCBA)n or A(BABCBA)n. Herein, n is the number of repeating units, and for example, when n=3 in A(BCA)n, it represents a lamination in order of ABCABCABCA in a thickness direction.

Further, the film must include each 30 layers or more of a layer composed of a resin A (A layer) and a layer composed of a resin B (B layer) alternately, more preferably 200 layers or more. Further, the total number of laminations of the A layer and the B layer is preferably 600 layers or more. When it does not include a structure where each 30 layers or more of the A layer and the B layer are laminated, a sufficient reflectance is not obtained, which does not provide an appearance with a high brightness and a metal-effect. Further, when it includes each 200 layers or more of the layer composed of a resin A (A layer) and the layer composed of a resin B (B layer) alternately laminated, it becomes easy to make the relative reflectance in a wavelength range of 400 nm to 1000 nm 40% or more. Further, when the total number of laminations of the A layer and the B layer is 600 layers or more, it becomes easy to make a relative reflectance in a wavelength range of 400 nm to 1000 nm 60% or more, and it becomes easy to have a metal-effect appearance with a very high brightness. Further, the upper limit of the number of laminations is not particularly restricted, but it is preferably 1500 layers or less considering the lowering of wavelength selectivity accompanied with the lowering of lamination accuracy resulting from a large-scale apparatus and too many layers.

The laminated film must have 30% or more of a relative reflectance in a wavelength range of 400 nm to 1000 nm. That is, a relative reflectance in the wavelength range of 400 nm to 1000 nm obtained by a measuring method of the relative reflectance must be 30% or more. When the relative reflectance in the wavelength range of 400 nm to 1000 nm is 30% or more, it becomes possible to obtain a film with a high brightness and a metal-effect. Further, the film maintains the metal-effect after forming and color change hardly occurs by the view angle. It is because a relative reflectance is 30% or more in a longer wavelength side (700 nm or more) than visible light, so that a relative reflectance in a visible light region is maintained at 30% or more even if the film thickness becomes thin due to stretching or the reflection band shifts toward a shorter wavelength side by the view angle. More preferably, a relative reflectance in the wavelength range of 400 nm to 1000 nm must be 40% or more. Further preferably, a relative reflectance in the wavelength range of 400 nm to 1000 nm must be 80% or more. The higher the relative reflectance, the higher brightness of the metal-effect becomes possible. Further, it is more preferable that a relative reflectance in the wavelength range of 400 nm to 1200 nm is 30% or more. In this case, it becomes possible to maintain a metal-effect with almost no occurrence of coloring even if formed in a higher drawing ratio.

The tensile stresses at 100% elongation in a longitudinal direction and a width direction of the film must be 3 MPa or more and 90 MPa or less in a tensile test at 150° C. In this case, formability becomes good, and the film is easily formed into an arbitrary shape by various forming such as vacuum forming, vacuum-pneumatic forming, plug-assisted vacuum-pneumatic forming, in mold forming, insert molding, cold forming, press forming or draw forming. More preferably, the tensile stresses at 100% elongation in a longitudinal direction and a width direction of the film are 3 MPa or more and 50 MPa or less in a tensile test at 150° C. In this case, it becomes possible to form the film in a higher drawing ratio. To set tensile stresses at 100% elongation in a longitudinal direction and a width direction of the film to be 3 MPa or more and 90 MPa or less in a tensile test at 150° C., it is preferable that the resin A is a crystalline resin and the resin B is a non-crystalline resin having a bulky group such as cyclohexanedimethanol, spiroglycol or neopentyl glycol. In this case, since the resin B hardly gets orientated or crystallized after biaxial stretching, the tensile strength becomes low. It is also preferable to take 3 minutes or more to form a laminate composed of an A layer and a B layer at the melting point of each resin or more and solidify the laminate by cooling. This is assumed because the tensile stress becomes low since a mixed layer formed in an interface between the A layer and the B layer becomes thick. Further, it is preferable that a layer having a thickness of 20 nm or less is contained. When the layer thickness becomes 20 nm or less, the tensile stress is lowered because it becomes more difficult for orientation and crystallization to proceed further by stretching.

Further, the number of layers with a layer-pair thickness of 10 nm or more and less than 220 nm must be more than the number of layers with a layer-thickness of 220 nm or more and 320 nm or less. By doing so, it becomes possible to obtain a metal-effect with almost no coloring. The layer-pair thickness is a thickness summing up the respective layer thicknesses of the adjacent layer composed of a resin A (A layer) and the layer composed of a resin B (B layer). Further, the layer-pair thickness must be the sum of layer thicknesses of the mth A layer numbered from a surface of one side for only the A layer and the mth B layer numbered from the surface for only the B layer. Herein, m represents an integer. For example, when lined in order of A1 layer/B1 layer/A2 layer/B2 layer/A3 layer/B3 layer from a surface of one side to a surface of the opposite side, A1 layer and B1 layer is the first layer-pair, A2 layer and B2 layer is the second layer-pair, and A3 layer and B3 layer is the third layer-pair. When the number of layers with a layer-pair thickness of 10 nm or more and less than 220 nm is the same or less than the number of layers with a layer-thickness of 220 nm or more and 320 nm or less, since the reflectance is more lowered at a shorter wavelength side in the reflection band of 400 nm to 1000 nm, it is not preferable because of a red-tinged appearance. This takes place because the density of the layer-pair generating reflection at a shorter wavelength side becomes low. Therefore, for the order of layer-pair thicknesses of layers constituting a laminated film, it is preferable that the layer-pair thickness increases or decreases in geometric progression while satisfying the above-described conditions rather than that the layer-pair thickness increases or decreases monotonically in arithmetic progression. More preferably, it is preferable that the number of layers with a layer-pair thickness of 120 nm or more and less than 220 nm is 1.05 times or more to 2.5 times or less the number of layers with a layer-thickness of 220 nm or more and 320 nm or less. In this case, a metal-effect with no coloring at all is possible.

It is preferable that the average transmittance in a wavelength range of 400 nm to 1000 nm is 4% or more and 55% or less. When the average transmittance in the wavelength range of 400 nm to 1000 nm is 4% or more and 55% or less, it is possible to obtain a dark-tinged metal-effect with a high brightness. Although it is preferable that the reflectance is high to increase brightness, generally, a preferable one for a metal-effect decoration is a "dark-tinged" one, for which, visible light is not completely reflected but preferably is partly absorbed. Thus, in the case where the transmittance is smaller than 4% because of too high a reflectance, almost no absorption takes place, resulting in a mirror-like state, but a metal texture cannot be exhibited completely. It is more preferable that the average transmittance in the wavelength range of 400 nm to 1000 nm is 20% or more and 55% or less. In this case, it becomes possible to exhibit the best metal texture.

It is preferable that the dynamic friction coefficient of at least one surface of the laminated film is 0.5 or less. When the dynamic friction coefficient of the laminated film is 0.5 or less, formability is further improved because slip between the film and a mold used for molding becomes better.

It is preferable that the relative reflectance of a region stretched 1.2 times or more and 2 times or less in a wavelength range of 400 nm to 700 nm is 30% or more. When the relative reflectance of a region stretched 1.2 times or more and 2 times or less in the wavelength range of 400 nm to 700 nm is 30% or more, it is possible to maintain a metal-effect without coloring after forming.

Preferably, on at least one surface the film has a layer of 3 μm or more in which polyethylene terephthalate or polyethylene naphthalate is a major component. More preferably, the film has a layer of 5 μm or more in which polyethylene terephthalate or polyethylene naphthalate is a major component. Further preferably, on both surfaces the film has a layer of 3 or more in which polyethylene terephthalate or polyethylene naphthalate is a major component. In the case there is no layer of 3 μm or more composed of polyethylene terephthalate or polyethylene naphthalate, it is not preferable because a scar appears markedly when the surface is scared.

A functional layer may be formed on the film's surface, such as an easy adhesion layer, an easy slipping layer, a hard coating layer, an antistatic layer, an abrasion resistance layer, an antireflection layer, a color adjusting layer, an ultraviolet absorbing layer, a printing layer, a metal layer, a transparent conductive layer, a gas barrier layer, a hologram layer, a separation layer, a sticking layer, an emboss layer or an adhesive layer. The molded body must include the above-described laminated film. Other than the laminated film, it is preferable to include any one of a hard coating layer, an emboss layer, a weather resistant layer (UV cut layer), a colored layer, an adhesive layer, a substrate resin layer and the like. Such molded body can be constituted by a polymer alone, and since it contains no metal or heavy metal, the environmental burden is small, is excellent in recycle efficiency and no electromagnetic interference is generated. In the molded body, in particular, it is preferable to have a colored layer. In the laminated film, since there is a case where a part of visible light is transmitted, it is possible to adjust color tone of the molded body by disposing a colored layer. Further, the molded body can be obtained at low costs because it is possible to adopt various forming methods such as vacuum forming, vacuum-pneumatic forming, plug-assisted vacuum-pneumatic forming, in mold forming, insert molding, cold forming, press forming and draw forming. Such molded body can be preferably used in a cellular phone, a telephone, a personal computer, an audio instrument, a household electric appliance, a wireless apparatus, a car-mounted component, a building material, a game machine, an amusement instrument and a packing container. In particular, the molded body is preferably used as a decorative component in an apparatus with a function communicating wirelessly (wireless communication apparatus) such as a cellular phone, a telephone, a personal computer, an audio instrument, a household electric appliance, a wireless apparatus, a car-mounted component or a game machine. The molded body has a metal-effect appearance and is also excellent in electromagnetic transmittance. Thus, it does not cause electromagnetic interference unlike conventional metal-effect decorative materials. Therefore, when the molded body is used as a decorative component in a wireless communication apparatus, it is possible to miniaturize and thin an apparatus, and freedom of circuit design inside a communication apparatus is increased.

Further, the laminated film can be utilized as a half mirror. A half mirror acts as a mirror in one condition and acts as a transparent body in another condition. To act as a mirror, light is adjusted to reduce transmitted light to be as low as possible. In using the laminated film as a half mirror, it is preferable that a relative reflectance in a wavelength range of 400 nm to 1000 nm is 30% or more and 70% or less. Further, it is preferable to use the laminated film which is formed integrally with a transparent resin. Further, it is possible to form a part to be a mirror and a part to be a half mirror at the same time by disposing a light shielding layer onto a part of at least one surface of the laminated film. That is, the part in which a light shielding layer was disposed always undergoes no light transmission, resulting in being like a mirror. On the other hand, the part in which a light shielding layer was not disposed becomes a half mirror. For the light shielding layer, a method in which a black layer is formed by printing or the like is convenient. Such half mirror can be preferably used in a cellular phone, a telephone, a personal computer, an audio instrument, a household electric appliance, a wireless apparatus, a car-mounted component, a building material, a game machine, an amusement instrument, a packing container and the like.

The circuit-mounted sheet must include at least the above-described laminated film and a conductive patterned layer. Since the laminated film has a metal-effect appearance but is composed of a polymer, it is not electroconductive. Therefore, the film functions as a circuit without problems even when a conductive pattered layer is formed. The conductive pattered layer means a fine pattern formed by etching a metal foil, printing a metal paste or etching a deposited and sputtered membrane. Further, the film includes a metal wire or a metal deposited membrane used as an antenna. As the conductive substance, copper, aluminum, silver or the like is preferred. In particular, copper is most preferable in terms of a sending and receiving characteristic. On the other hand, from the viewpoint of lower cost, a silver paste is preferable because a conductive pattern can be formed by a printing method and a low-temperature heat treatment. These conductive patterned layers have a function as an antenna and a circuit.

The conductive patterned layer may be directly formed on the surface of the laminated film. It is also a preferable method that a conductive patterned layer is disposed on the surface of various heat resistance films such as a polyimide film, a polyphenylene sulfide film, a liquid crystal film, a polyethylene naphthalate film, a polyethylene terephthalate film, an alicyclic polyolefin film, a PETG film, an ABS film and a PVC film, and bonding it with the laminated film by adhesives or sticking agents.

On the other hand, the circuit-mounted sheet preferably has a colored layer. The colored layer means the one in which a pigment or a dye is dispersed in a resin-coating layer, a sticking layer or a film sheet to color. The color is not particularly limited, but can be selected variously from designing properties, and is particularly preferably, black. In this case, the colored layer is not only excellent in a designing property because a reflected color by the laminated film is emphatically seen, but can also easily hide a circuit because a shielding property is increased.

The laminated film constituting the circuit-mounted sheet preferably has a tan δ of 0.02 or less at 25 to 80° C. When the tan δ is 0.02 or less, for example, in forming a conductive patterned layer directly on a surface of the laminated film, neither the accuracy of the conductive pattern is lowered by heat history in the processing step nor the planarity is greatly deteriorated. Further, it becomes an excellent circuit-mounted sheet such that the insulating characteristic is not lowered even in a prolonged operation of the circuit.

It is also preferable that a colored layer and a conductive patterned layer are present on one surface side of the laminated film, and a printing layer is present on another surface side. In this constitution, the design printed on a metal-effect substrate is clearly observed.

Further, it is preferable that the laminated film constituting the circuit-mounted sheet has a three dimensional shape. That is, since the preferable laminated film is formable while having a metal-effect and excellent in the designing property, it is possible to produce a circuit having a complicated shape. For example, when a model in which a copper wire antenna coil is inserted is formed on the laminated film by vacuum pneumatic forming or the like, positioning of the antenna coil can be done very easily. Further, in this case, a metal-effect design is possible in such a manner that the antenna part stands out.

In the circuit-mounted sheet, it is preferable that the saturated water content of the laminated film is 1.0% or less. When the saturated water content is more than 1.0%, there is a case in which the sheet influences the transmission receiving characteristic in forming a noncontact IC card or the like. Further, in using the sheet as a circuit, when the saturated water content is more than 1.0%, there is a case where the distance between circuits changes by the influence of the humidity-expansion coefficient to cause an insulation failure. The IC card and the IC label must include the above-described circuit-mounted sheet. Other than the circuit-mounted sheet, it is preferable to include any one of a hard coating layer, an emboss layer, a weather resistant layer (UV cut layer), a colored layer, an adhesive layer and the like. In such IC card and IC label, the substrate of the circuit is constituted by polymer alone, and since it contains no metal or heavy metal, the environmental burden is small, is excellent in recycle efficiency and no electromagnetic interference is generated.

For the IC card and the IC label, it is possible to adopt various forming methods such as vacuum forming, vacuum-pneumatic forming, plug-assisted vacuum-pneumatic forming, in mold forming, insert molding, cold forming and press forming, thus, it is possible to form a three dimensional shape with a low cost. The IC card and the IC label of the present invention are suitable for a wireless IC card or a wireless IC label, and can provide a posh RFID tag.

Next, a preferable production method of the laminated film will be explained below.

Two kinds of resins A and B are prepared as pellets or the like. The pellets are dried in hot air or under vacuum according to need, and then fed to separate extruders. Each resin melt by heating to its melting point or higher in the extruder is homogenized in the throughput rate of the resin by a gear pump or the like, and foreign materials and degenerated resin are removed through a filter or the like.

The resins A and B fed out through separate channels using at least two extruders are next fed into a multilayer laminating apparatus. As the multilayer laminating apparatus, a multi manifold die, a feed block, a static mixer or the like can be used. Further, these may be combined arbitrarily. To include a structure where each 30 layers or more of a layer composed of a resin A (A layer) and a layer composed of a resin B (B layer) are alternately laminated, wherein the number of layers with a layer-pair thickness of 10 nm or more and less than 220 nm is more than the number of layers with a layer-pair thickness of 220 nm or more and 320 nm or less, it is preferable to use a feed block having at least one member with a lot of fine slits. Further, it is preferable to use a feed block having at least two members with a lot of fine slits separately (FIG. 1 to FIG. 4). By using such feed block, an apparatus needs no growing in size extremely, thus there is few foreign materials due to heat deterioration, which can laminate in a high degree of accuracy even in the case where the number of laminations is extremely large. The lamination accuracy in a width direction is also remarkably improved compared with the conventional technique. Further, it becomes possible to form a constitution with an arbitrary layer thickness. Therefore, it becomes easy to achieve the following constitutions of preferred laminated films:

a) The total number of laminations of a layer composed of a resin A (A layer) and a layer composed of a resin B (B layer) is 600 layers or more.

b) The relative reflectance in a wavelength range of 400 nm to 1000 nm is 80% or more c) The number of layers with a layer-pair thickness of 120 nm or more and less than 220 nm is 1.05 times or more to 2.5 times or less the number of layers with a layer-thickness of 220 nm or more and 320 nm or less.

d) Having a layer of 3 µm or more on at least one surface, in which polyethylene terephthalate or polyethylene naphthalate is a major component.

A feed block having at least two members with a lot of fine slits separately will be explained in detail below. The feed block is constituted of a "laminating apparatus" mainly shown in FIG. 1 and a "converging apparatus" shown in FIG. 4. The "laminating apparatus" shown in FIG. 1 is a part where a lamination is formed from resins A and B separately fed in the feed block. In FIG. 1, members 1 to 9 are disposed together in this order to form a laminating apparatus 10.

The laminating apparatus 10 in FIG. 1 has 4 resin feed ports in resin feed members 2, 4, 6 and 8, for example, the resin A is supplied from a feed port 11 of the resin feed members 2 and 6, and the resin B is supplied from a feed port 11 of the resin feed members 4 and 8.

In this case, a slit member 3 is provided with the resin A from the resin feed member 2 and with the resin B from the rein feed member 4; a slit member 5 is provided with the resin A from the resin feed member 6 and with the resin B from the rein feed member 4; and a slit member 7 is provided with the resin A from the resin feed member 6 and with the resin B from the rein feed member 8.

Figure 3:
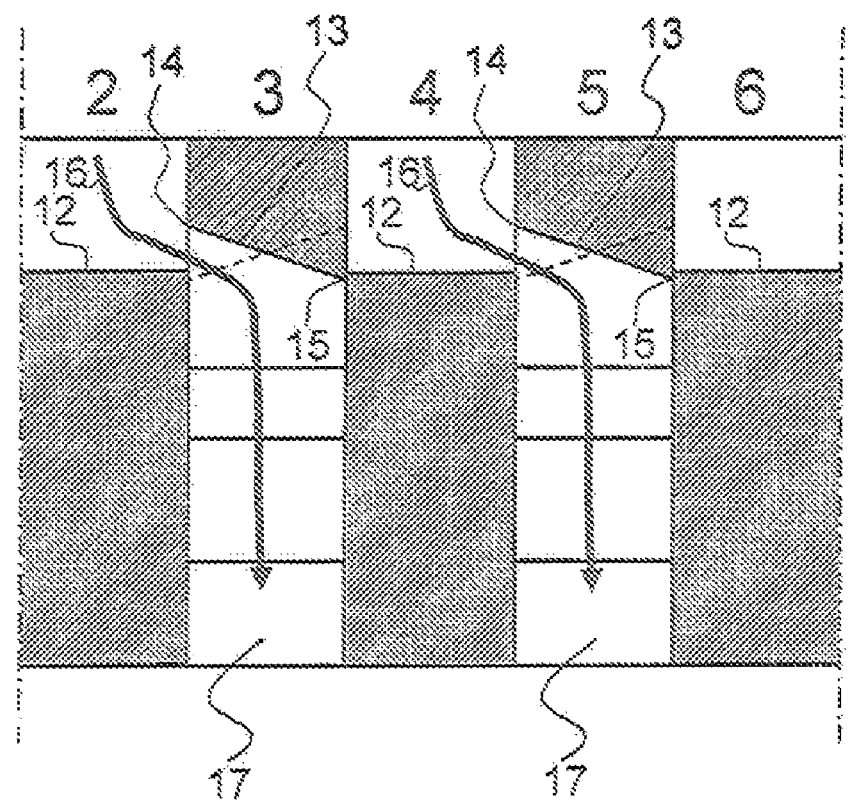
FIG. 3 is a sectional view showing a state that the slit part is bound to a resin feed part.

The kind of the resin introduced to each slit is determined by a positional relationship between the bottom surface of a liquid pooling part 12 in the resin feed members 2, 4, 6 and 8, and the edge part of each slit in the slit members. That is, as shown in FIG. 3, a ridge line 13 of a top of each slit in the slit members has a slope to the thickness direction of the slit member (FIGS. 2 (b), (c)). The height of the bottom surface of the liquid pooling part 12 in the resin feed members 2, 4, 6 and 8 is located in a height between an upper edge 14 and a lower edge 15 of the ridge line 13. In this way, a resin is introduced through the liquid pooling part 12 in the resin feed members 2, 4, 6 and 8 from the side where the ridge line 13 is raised (16 in FIG. 3), whereas at the side where the ridge line 13 is lowered, a slit becomes a blocked state and no resin is introduced. In this manner, since the resin A or B is selectively introduced to each slit, a resin flow with a lamination structure is formed in the slit members 3, 5 and 7, and the resin is flowed away through a flow exit 17 below the slit members 3, 5 and 7.

As a shape of the slit, it is preferable that a slit area at the side where a resin is introduced is not the same as a slit area at the side where a resin is not introduced. When such structure is provided, since distribution of the flow rate at the side where a resin is introduced and the side where a resin is not introduced can be reduced, lamination accuracy in a width direction is improved. Further, it is preferable that (slit area at the side where a resin is not introduced)/(slit area at the side where a resin is introduced) is 0.2 or more and 0.9 or less, more preferably 0.5 or less. Further, it is preferable that the pressure loss in a feed block is 1 MPa or more. Furthermore, it is preferable that a slit length (longer one in slit lengths in a Z direction in FIG. 1) is 20 mm or more. On the other hand, the thickness of each layer can be controlled by adjusting the space and length of slits.

Further, it is preferable that a manifold is provided corresponding to each slit. Since distribution of the flow rate in a width direction (Y direction in FIG. 1) inside a slit can be homogenized by the manifold, the lamination ratio of the laminated film in the width direction can be homogenized, which enables a film even with a large area to be laminated in good accuracy, and the reflectance of the reflection peak can be controlled in good accuracy.

Further, it is preferable that a resin is supplied to at least 2 slit members from one liquid pooling part. In doing so, even if slight distribution of the flow rate in the width direction inside a slit occurs, since lamination is further done by a converging apparatus explained below, the lamination ratio is homogenized in total, which enables irregularity of the higher-order reflection band to be reduced.

As shown in FIG. 1, the flow exit 17 below the slit members 3, 5 and 7 is disposed in a positional relationship such that lamination structures with the flows of three resins are in parallel and separated by the resin feed members 4 and 6 (19 L, 20L and 21L in FIG. 4). By a converging apparatus 18 shown in FIG. 4, like from L-L' to M-M', conversion of alignment is conducted there by the regulation of the flow path (19M, 20M and 21M in FIG. 4), and the lamination structures with the flows of three resins become serial. The resin flows are widen from M-M' to N-N' in FIG. 4 to converge in the downstream below N-N' in FIG. 4.

In this way, high-accuracy and arbitrary lamination of extremely thin resin layers becomes possible. In this apparatus, since the thickness of each layer can be adjusted by the shape of the slit (length and width), an arbitrary layer thickness can be achieved. On the other hand, in the conventional apparatus, it was common to use a square mixer concomitantly to achieve lamination of 300 layers or more, and it was difficult to obtain an arbitrary layer thickness because the lamination flow was deformed and laminated in a similar shape by such a method. Therefore, it was impossible to form a layer constitution in high accuracy and efficiency, wherein the number of layers with a layer-pair thickness of 10 nm or more and less than 220 nm is more than the number of layers with a layer-pair thickness of 220 nm or more and 320 nm or less.

Next, to set a relative reflectance in a wavelength range of 400 nm to 1000 nm to be 30% or more, it is necessary to design the thickness of each layer for reflection to take place at least in a wavelength range of 400 nm to 1000 nm on the basis of the following formula 1. Further, it is preferable at least to include a layer constitution where a layer-pair thickness gradually thickens from 120 nm to 320 nm toward a surface of the opposite side from a surface of one side. Further, the reflectance is controlled by a refractive index difference between the A layer and the B layer, and the numbers of layers of the A layer and the B layer.

$$2 \times (na \cdot da + nb \cdot db) = \lambda \qquad \text{formula 1}$$

na: average in-plane refractive index of A layer
nb: average in-plane refractive index of B layer
da: layer thickness of A layer (nm)
db: layer thickness of B layer (nm)
λ: main reflection wavelength (primary reflection wavelength)

Figure 5:
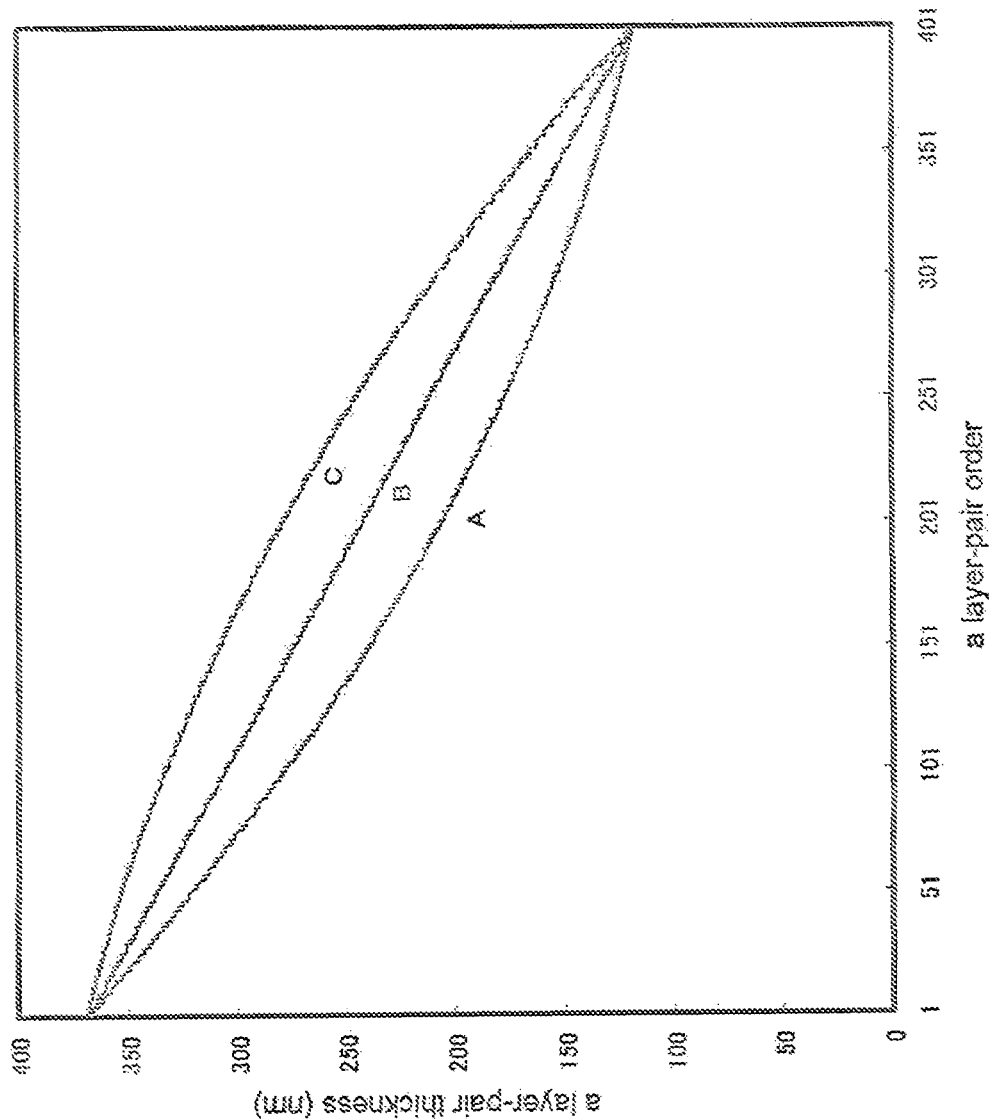
FIG. 5 is a layer-constituting profile.

Further, the number of layers with a layer-pair thickness of 10 nm or more and less than 220 nm must be more than the number of layers with a layer-pair thickness of 220 nm or more and 320 nm or less and, therefore, it is preferable that a layer-pair thickness does not increase or decrease in a liner function to the layer-pair order along toward a surface of the opposite side from a surface of one side, but change of layer-pair thickness in less than 220 nm is more gradual than that in 220 nm to 320 nm. It is explained specifically using FIG. 5. FIG. 5 shows several examples designed so that the layer-pair thickness changes against the layer-pair order in 118 to 370 nm to reflect a wavelength range of 400 nm to 1200 nm. In this example, A type is preferable because the number of layers with a layer-pair thickness of 10 nm or more and less than 220 nm is more than the number of layers with a layer-thickness of 220 nm or more and 320 nm or less. On the other hand, B type is not preferable because it tends to have a metal-effect with coloring from the fact that the number of layers with a layer-pair thickness of 10 nm or more and less than 220 nm is the same as the number of layers with a layer-thickness of 220 nm or more and 320 nm or less. Further, C type is not preferable because coloring is further increased from the fact that the number of layers with a layer-pair thickness of 10 nm or more and less than 220 nm is less than the number of layers with a layer-thickness of 220 nm or more and 320 nm or less.

It is preferable to design a layer constitution that the thickness gradually becomes thin from the maximum layer-pair thickness to the minimum layer-pair thickness. In this case, small irregularity of lamination is allowed.

Now, in this way, the melt lamination formed in a desired layer constitution is next molded in a target shape by a die, and then, discharged. The sheet laminated in a multilayer that was discharged from the die is extruded on a cooling body such as a casting drum, solidified by cooling, thereby to obtain a casting film. In this case, it is preferable that using an electrode being in a wire-like, tape-like, needle-like or knife-like shape, the sheet is quenched and solidified by closely contacting it on a cooling body such as a casting drum through electrostatic force. It is also a preferable method to closely contact the sheet on a cooling body such as a casting drum to quench and solidify it by blowing air from an apparatus being in a slit-like, spot-like or plane-like shape, or to closely contact the film on a cooling body by a nip roller to quench and solidify it.

It is preferable that the thus obtained casting film is biaxially stretched according to need. Biaxial stretching means stretching in a longitudinal direction and a width direction. Stretching may be conducted sequentially or simultaneously in two directions. Further, restretching may be conducted in a longitudinal direction and/or a width direction. In particular, it is preferable to use simultaneous biaxial stretching from the viewpoints that the difference of in-plane orientations can be suppressed and the surface scar is suppressed.

The case of sequential biaxial stretching is first described. Stretching in a longitudinal direction means stretching for giving a film a molecular orientation in a longitudinal direction, generally, it is conducted by a circumferential velocity difference of rolls, and this stretching may be conducted in one step or in multi steps using a plurality of roll pairs. The stretch ratio varies depending on the kind of the resin, and in general, 2 to 15 times is preferable, and in the case where polyethylene terephthalate is used as any one of resins constituting a laminated film, 2 to 7 times is particularly preferably used. Further, the stretching temperature is preferably a glass transition temperature of a resin constituting a laminated film to the glass transition temperature +100° C.

The uniaxially stretched film thus obtained is subjected to surface treatment such as corona treatment, flame treatment or plasma treatment according to need, and then, functions such as easy slippage, easy adhesion and antistatic property may be provided by inline coating.

Further, stretching in a width direction means stretching for giving a film an orientation in a width direction, and in general, it is stretched in a width direction through delivery while holding both edges of film by clips using a tenter. The stretch ratio varies depending on the kind of the resin, and in general, 2 to 15 times is preferable, and in the case where polyethylene terephthalate is used as any one of resins constituting a laminated film, 2 to 7 times is particularly preferably used. Further, the stretching temperature is preferably a glass transition temperature of a resin constituting a laminated film to the glass transition temperature +120° C.

In this way, the film biaxially stretched is preferably heat-treated in a tenter at the stretching temperature or more and the melting point or less to be provided with planarity and dimensional stability. After being heat-treated in this way, the film is slowly cooled uniformly, and cooled to room temperature to be wound. Further, according to need, relaxing treatment or the like may be concomitantly used in slowly cooling the film from the heat treatment.

Simultaneous biaxial stretching is described next. In the case of simultaneous biaxial stretching, the cast film obtained is subjected to surface treatment such as corona treatment, flame treatment or plasma treatment according to need, and then, functions such as easy slippage, easy adhesion and antistatic property may be provided by inline coating.

Next, the cast film is introduced to a simultaneous biaxial tenter, and the film is stretched in a longitudinal direction and a width direction simultaneously and/or in a stepwise manner through delivery while holding both edges of the film by clips. As the simultaneous biaxial stretching machine, there are a pantograph type, a screw type, a drive motor type and a linear motor type, and preferable is the drive motor type or the linear motor type in which the stretch ratio can be arbitrarily changed and relaxing treatment can be conducted at an arbitrary place. The stretch ratio varies depending on the kind of the resin, and in general, 6 to 50 times is preferable as an area ratio. In the case where polyethylene terephthalate is used as any one of resins constituting a laminated film, 8 to 30 times as an area ratio is particularly preferably used. In simultaneous biaxial stretching, particularly, it is preferable that stretch ratios in a longitudinal direction and a width direction are set to the same and stretching velocities are also almost the same to suppress the difference of in-plane orientations. Further, the stretching temperature is preferably a glass transition temperature of a resin constituting a laminated film to the glass transition temperature +120° C.

In this way, the film biaxially stretched is preferably successively heat-treated in a tenter at the stretching temperature or more and the melting point or less to be provided with planarity and dimensional stability. In this heat treatment, to prevent distribution of the main orientation axis in a width direction, it is preferable to conduct a relaxing treatment very quickly in a longitudinal direction right before and/or after entering a heat treatment zone. After being heat-treated in this way, the film is slowly cooled uniformly, and cooled to room temperature to be wound. Further, according to need, relaxing treatment may be conducted in a longitudinal direction and/or a width direction in slowly cooling from the heat treatment. The film is subjected to a relaxing treatment very quickly in a longitudinal direction right before and/or after entering a heat treatment zone.

EXAMPLES

Evaluation methods of physical property values will be described.

(Evaluation Methods of Physical Property Values)

(1) Observation of Film Cross Section

The layer constitution of a film was obtained by an electron microscopic observation of the cross section of a sample cut out using a microtome. That is, using a transmission electron microscope HU-12 model (manufactured by Hitachi Ltd.), the cross section of a film was observed in 40000 magnifications and the cross sectional picture was taken. Additionally, in our examples, it was stained using $RuO_4$ to obtain a sufficient contrast.

(2) Relative Reflectance

The reflectance was measured by setting a $\phi 60$ integral sphere 130-0632 (Hitachi Ltd.) and a 10° tilt spacer to a U-3410 Spectrophotometer manufactured by Hitachi Ltd. Additionally, the measurement was done as follows; the band parameter was 2/servo, the gain was set to 3, and the detection velocity was 120 nm/min. in a range of 187 nm to 2600 nm. Further, an attached $Al_2O_3$ plate was used as a standard reflection plate to standardize the reflectance. The reflectance of an integer wavelength in a target wavelength range was obtained.

(3) Intrinsic Viscosity

The intrinsic viscosity Was calculated from the solution viscosity measured at 25° C. in ortho-chlorophenol. Further, the solution viscosity was measured using an Ostwald viscometer. The unit was shown in [dl/g]. Additionally, the n number was 3 and the average was adopted.

(4) Peeling Test

The test was carried out according to JIS K5600 (year 2002). Additionally, a film was assumed as a hard substrate, 25 lattice-like patterns were cut thereon at intervals of 2 mm. Further, a tape cut to about 75 mm in length was bonded on the part of the lattice and the tape was peeled at an angle of about 60° in a time of 0.5 to 1.0 seconds. As the tape, Cellotape (trademark) No. 252 (18 mm in width) manufactured by Sekisui Chemical Co., Ltd. was used. The evaluation result was expressed by the number of lattices in which one lattice was completely peeled.

(5) Glass Transition Temperature

Using a differential scanning calorimeter (DSC), the glass transition temperature was measured and calculated according to RS-K-7122 (year 1987). Additionally, first, in the 1st run, the temperature was raised at 20° C./min. from 25° C. to 290° C., and held at 290° C. for 5 minutes, and then quenched to 25° C. Subsequently, in the 2nd run, the temperature was raised at 20° C./min. from 25° C. to 290° C. The glass transition temperature in the 2nd run was adopted as the glass transition temperature of the resin.

Apparatus: "Robot DSC-RDC220" manufactured by Seiko Instrument Inc.

Data analysis: "Disk session SSC/5200"

Mass of sample: 5 mg (6) Number of Lamination; Thickness of Layer-Pair

The cross section image of the film (a pictorial image of 40000 magnifications) obtained by a transmission electron microscope was loaded into an image size of 720 dpi using a scanner (Canon Scan D123U manufactured by Canon Inc.) and saved in a bit map file (BMP). Next, using image-processing software Image-Pro Plus ver. 4 (manufactured by Media Cybernetics Corp.), this BMP file was opened to conduct an image analysis. A typical image processing condition is described below. First, after a low pass filter treatment (size: 7×7, strength: 10, number: 10), numerical data of the position and brightness were obtained in a vertical thick profile mode. Additionally, the position was previously scaled by spatial calibration. The data of this position and brightness were subjected to sampling step 6 (pixel skipping 6) on EXCEL 2000 manufactured by Microsoft Corporation, and further to a three-point moving average treatment. Furthermore, the brightness obtained was differentiated by the position to calculate the maximal value and the minimal value of the differential curve. Then, an interval of the position between the adjacent maximal value—maximal value, or the adjacent minimal value—minimal value was defined as a layer-pair thickness, and all layer-pair thicknesses were calculated. Additionally, in this case, not to detect noise of the differential curve, by setting a constant threshold value to the differential value, it was treated to detect a distance between the adjacent maximal value—maximal value, or the adjacent minimal value—minimal value corresponding to the layer-pair thickness.

(7) Transmittance

The transmittance was measured by setting an attached cell for parallel light to a U-3410 Spectrophotometer manufactured by Hitachi Ltd. Additionally, the measurement was done as follows; the band parameter was 2/servo, the gain was set to 3, and the detection velocity was 120 nm/min. in a range of 187 nm to 2600 nm.

(8) Friction Coefficient

As the friction coefficient between films, according to ASTM-D-1894-63, a dynamic friction coefficient was measured using a surface nature tester, HEIDON-14DR manufactured by Shinto Science Co., Ltd. in the conditions of a sample moving speed of 200 mm/min, a load of 200 g and a contact area of 63.5 mm×63.5 mm, recorded in an analyzing recorder, TYPE: HEIDON3655E-99 and evaluated.

(9) Stretching

Using a film stretcher manufactured by Toyo Seiki Seisaku-sho, Ltd., a film simultaneously biaxially stretched at a temperature of 150° C. 1.2 times in a longitudinal direction and 1.2 times in a lateral direction was produced. The film obtained was measured for a relative reflectance at the part of the film thickness of 1/1.4 to 1/1.6 relative to the film thickness before stretching.

(10) Appearance

The appearance was evaluated by a naked eye and defined as ● when a metal-effect without coloring was obtained, ○ when a metal-effect with slight coloring was obtained, and x when the film was colored or tinted when tilted.

(11) Glossiness

The specular glossiness at 60° was measured according to a method defined by JIS-K7105 (1981) using a digital variedangle glossiness tester, UGV-5D produced by Suga Test Instruments Co., Ltd. Additionally, it was measured by inserting a filer through which light is all reduced by 1/10 because of too high glossiness for measurement.

(12) Lightness, Color, Chroma

Using a spectro-colorimeter, CM-3600d manufactured by Konica Minolta Holdings Inc., lightness L* and Color (a*, b*) of a film were measured in the following conditions, by setting a zero constitution of the reflectance with an attached zero constituting box and consequently conducting 100% calibration using an attached white color calibration plate. The definitions of lightness and color are in accordance with JIS Z8729 (year 2004).

Mode: reflection, SCI/SCE simultaneous measurement

Measuring diameter: 8 mm

Sample: black ink coated on non-measurement side

Further, chroma (C*) was listed in the results of Examples. The definition of chroma is as follows; less coloring is generated as chroma is near zero.

$$C^* = ((a^*)^2 + (b^*)^2)^{1/2}$$

Color (a*, b*) used for calculation of chroma is SCI values.

(13) Formability

The formability was tested by using a vacuum forming apparatus, SANWA KOGYO PLAVAC TYPE FB-7. A cylindrical cup of 15 mm in depth and 50 mm in diameter was stuck on a sample heated to 200° C., and further, air inside the cup was pulled out instantly to vacuum. At this time, formability was evaluated high when the sample was deformed following the shape of the cup, which is expressed as ●. Further, when the sample was deformed following the shape of the cup but was not sufficiently formed at a corner part, the sample is evaluated as ○. Further, when the sample did not follow the cup and hardly deformed, the sample was expressed as poor in formability and is evaluated as x.

(14) Electromagnetic Shielding Property

According to a KEC method of Kansai Electronic Industry Development Center, the electromagnetic shielding property was measured. The measuring conditions are as follows:

Measuring Apparatus:
Signal generator: MG3601A manufactured by Anritsu Corp.
Spectrum analyzer: MS2601A manufactured by Anritsu Corp.
Preamplifier: MH648A manufactured by Anritsu Corp.
Measuring method: KEC method (local electric field, local magnetic field)
Measuring frequency: 0.1 to 1 GHz
Sample size: 150 mm×150 mm
Spacer: steel wool ("Bonstar")
Sample measurement: measurement was conducted three times for one sample, and the average was adopted.

For the evaluation result, the electric field shielding property at 800 MHz was represented by the attenuation rate (dB). Additionally, the attenuation rate of an aluminum-deposited film often used generally as a metal-effect decorative film was 46 dB.

Example 1

1. Synthesis of Polyester 1

67.6 parts by weight of dimethyl terephthalate, 17.4 parts by weight of dimethyl 1,4-cyclohexanedicarboxylate having a cis/trans ratio of 72/28, 54 parts by weight of ethylene glycol, 20 parts by weight of spiroglycol, 0.04 parts by weight of manganese acetate tetrahydrate and 0.02 parts by weight of antimony trioxide were each weighed, and loaded in an ester-exchange reactor. The content was dissolved at 150° C. and stirred. Next, while the temperature of the reaction content was slowly raised to 235° C. under stirring, methanol was distilled away. After a predetermined amount of methanol was distilled away, an ethylene glycol solution containing 0.02 parts by weight of trimethylphosphoric acid was added thereto. After stirring for 10 minutes from the addition of trimethylphosphoric acid, the ester-exchange reaction was finished. Thereafter, the ester-exchange reaction product was transferred to a polymerization apparatus.

Next, while stirring the content inside the polymerization apparatus, pressure reduction and temperature rising were conducted, and polymerization was carried out while distilling ethylene glycol away. Additionally, the pressure reduction was conducted so that the pressure was reduced from normal pressure to 133 Pa or less over 90 minutes, and the temperature rising was conducted so that the temperature was raised from 235° C. to 285° C. over 90 minutes. When a stirring torque of the polymerization apparatus reached a predetermined value, inside of the polymerization apparatus was returned to normal pressure with a nitrogen gas, and a valve at the lower part of polymerization apparatus was opened to discharge a gut-like polymer into a water tank. The polyester gut cooled in the water tank was cut by a cutter to give a polyester 1 as a chip.

The intrinsic viscosity of the polyester 1 obtained was 0.72. The component of dicarboxylic acid of this polyester 1 contained 80 mol % of terephthalic acid and 20 mol % of cyclohexanedicarboxylic acid. Further, the component of diol of the polyester 1 contained 85 mol % of ethylene glycol and 15 mol % of spiroglycol.

2. Synthesis of Polyester 2

A polyester 2 (polyethylene terephthalate) was polymerized in the same manner as described above except that 100 parts by weight of dimethyl terephthalate and 64 parts by weight of ethylene glycol were similarly used. The intrinsic viscosity of the polyester 2 obtained was 0.65 and Tg was 80° C.

As two kinds of thermoplastic resins, a thermoplastic resin A and a thermoplastic resin B were prepared. In Example 1, as the resin A, the polyester 2 (PET) added with 0.04 wt % of a coagulated silica particle having an average secondary particle diameter of 1 μm was used. Additionally, this resin A was a crystalline resin. Further, as the resin B, the polyester 1 (PE/SPG·T/CHDC) was used. Additionally, this resin B was a non-crystalline resin. These resins A and B were each dried and supplied to separate extruders.

The resins A and B were separately heated in the respective extruders into a melt state at 280° C., and through gear pumps and filters, converged in a feed block of 801 layers. As the feed block of 801 layers, apparatuses as shown in FIG. 1 and FIG. 4 were used. Additionally, a laminating apparatus in the feed block was constituted by three slit members having 267 slits each. The resins A and B converged were changed so that the thickness of each layer in the feed block is gradually thickened toward an opposite surface side from a surface side, forming a structure in which 401 layers of the resin A and 400 layers of the resin B are alternately laminated in a thickness direction. The thickness of each layer-pair targeted the A line in FIG. 5, from which the flow rate of a polymer flowing in each slit was calculated to design the shape of each fine slit in the feed block. Further, the slit shape was designed in such way that both surface parts were the resin A and the layer thicknesses of the adjacent A layer and the B layer were almost the same. In this design, a reflection band exists in 400 nm to 1200 nm. The thus obtained lamination constituted by 801 layers in total was supplied to a multi manifold die, and further, on the surface layer, a layer of the resin A supplied from another extruder was formed, after being formed in a sheet, which was quenched and solidified on a casting drum whose surface temperature was held at 25° C. by means of electrostatic loading. Additionally, the flow path shape and the total discharge amount were set so that it took about 8 minutes from the convergence of the resin A and the resin B in the laminating apparatus to be quenched and solidified on the casting drum.

The cast film obtained was heated by a group of rolls set at 75° C., then, in a stretching section length of 100 mm, stretched 3.0 times in a longitudinal direction while the film was rapidly heated from both surfaces by a radiation heater, and thereafter once cooled. Subsequently, both surfaces of this uniaxially stretched film were subjected to corona discharging treatment in air, setting the wetting tension of the substrate film to 55 mN/m, and on the treated surface, a lamination forming membrane coating liquid composed of (a polyester resin with a glass transition temperature of 18° C.)/(a polyester resin with a glass transition temperature of 82° C.)/a silica particle with an average particle diameter of 100 nm was applied, thereby to form a transparent, easy slippage and easy adhesion layer.

This uniaxially stretched film was introduced to a tenter, and after the film was preheated by hot air at 100° C., it was stretched 3.3 times at 110° C. in a lateral direction. The stretched film without change was heat-treated by hot air at 240° C. in the tenter, subsequently, subjected to relaxing treatment of 8% at the same temperature in a width direction, and then, slowly cooled to room temperature and wound up. The thickness of the film obtained was 100 μm. The result obtained is shown in Table 1.

Example 2

In place of the resin B in Example 1, polyethylene terephthalate copolymerized with 30 mol % of cyclohexanedimethanol relative to ethylene glycol (PE/CHDM·PET) [PETG6763 manufactured by Eastman Corporation] was used. Additionally, the polyethylene terephthalate copolymerized with 30 mol % of cyclohexanedimethanol relative to ethylene glycol (PE/CHDM·T) was a non-crystalline resin. Other conditions and the apparatus were the same as in Example 1. The thickness of the film obtained was 100 μm. The result obtained is shown in Table 1.

Example 3

In Example 2, the flow path shape and the total discharge amount were set so that it took about 2.5 minutes from the convergence of the resin A and the resin B to being quenched and solidified on the casting drum. Other conditions and the apparatus were the same as in Example 2. The thickness of the film obtained was 100 μm. The result obtained is shown in Table 1.

Example 4

In place of the resin A in Example 2, the polyester 2 (PET) added with 0.02 wt % of a coagulated silica particle with an average secondary particle diameter of 1 μm was used. Additionally, this resin A was a crystalline resin. Other conditions and the apparatus were the same as in Example 2. The thickness of the film obtained was 100 p.m. The result obtained is shown in Table 1.

Example 5

In Example 2, the thickness of each layer-pair targeted a medium line between B and A in FIG. 5, from which the flow rate of each slit was calculated to adjust the shape of a fine slit (formed at a processing accuracy of 0.01 mm) provided in the flow path of each layer in the feed block. Other conditions and the apparatus were the same as in Example 2. The thickness of the film obtained was 100 μm. The result obtained is shown in Table 1.

Example 6

In Example 1, the same conditions and apparatus were used except that the feed block was changed. The feed block used was a feed block of 401 layers, and the laminating apparatus was constituted by two slit members one having 200 slits and the other having 201 slits. The resins A and B converged were changed so that the thickness of each layer in the feed block is gradually thickened toward an opposite surface side from a surface side, forming a structure in which 201 layers of the resin A and 200 layers of the resin B are alternately laminated in a thickness direction. The shape of each fine slit in the feed block was adjusted so that the layer-pair thickness in a thinner side was set relatively more in the same manner as in Example 1. Further, the slit shape was designed so that both surface layer parts were the resin A and the layer thicknesses of the adjacent A layer and the B layer were almost the same. The thickness of the film obtained was 50 μm. The result obtained is shown in Table 2.

Example 7

In Example 1, the same conditions and apparatus were used except that the feed block was changed. The feed block used was a feed block of 201 layers, and constituted by one slit member having 201 slits as shown in FIG. 6. The resins A and B converged were changed so that the thickness of each layer in the feed block gradually thickened toward an opposite surface side from a surface side, forming a structure in which 101 layers of the resin A and 100 layers of the resin B are alternately laminated in a thickness direction. The shape of each fine slit in the feed block was adjusted so that the layer-pair thickness in a thinner side was set relatively more in the same manner as in Example 1. Further, the slit shape was designed so that both surface layer parts were the resin A and the layer thicknesses of the adjacent A layer and the B layer were almost the same. The thickness of the film obtained was 25 μm. The result obtained is shown in Table 2.

Example 8

In Example 1, the flow path shape and the total discharge amount were set so that it took about 2.5 minutes from the convergence of the resin A and the resin B to being quenched and solidified on the casting drum. Other conditions and the apparatus were the same as in Example 1. The thickness of the film obtained was 100 μm. The result obtained is shown in Table 2.

Example 9

In Example 1, the thickness of each layer-pair targeted a medium line between B and A in FIG. 5, from which the flow rate of each slit was calculated to adjust the shape of a fine slit (formed at a processing accuracy of 0.01 mm) provided in the flow path of each layer in the feed block. Other conditions and the apparatus were the same as in Example 1. The thickness of the film obtained was 100 p.m. The result obtained is shown in Table 2.

Example 10

In Example 1, the shape of each fine slit in the feed block was adjusted so that a reflection band existed in 400 nm to 1400 nm and the layer-pair thickness in a thinner side was set relatively more in the same manner as in Example 1. Other conditions and the apparatus were the same as in Example 1. The thickness of the film obtained was 110 p.m. The result obtained is shown in Table 2.

Example 11

In Example 1, the same conditions and apparatus were used except that the feed block was changed. The feed block used was a feed block of 1005 layers, and the laminating apparatus in the feed block was constituted by three slit members having 335 slits each. The resins A and B converged were changed so that the thickness of each layer in the feed block gradually thickened toward an opposite surface side from a surface side, forming a structure in which 503 layers of the resin A and 502 layers of the resin B are alternately laminated in a thickness direction. The shape of each fine slit in the feed block was adjusted so that a reflection band existed in 400 nm to 1000 nm and the layer-pair thickness in a thinner side was set relatively more in the same manner as in Example 1. Further, the slit shape was designed so that both surface layer parts were the resin A and the layer thicknesses of the adjacent A layer and the B layer were almost the same. The thickness of the film obtained was 90 p.m. The result obtained is shown in Table 3.

Comparative Example 1

In Example 1, the thickness of each layer-pair targeted the B line in FIG. 5, from which the flow rate of each slit was calculated to adjust the shape of a fine slit provided in the flow path of each layer in the feed block. Other conditions and the apparatus were the same as in Example 1. The thickness of the film obtained was 100 µm. The result obtained is shown in Table 3.

Comparative Example 2

In Example 7, the flow path shape and the total discharge amount were set so that it took about 1 minute from the convergence of the resin A and the resin B in the laminating apparatus to being quenched and solidified on the casting drum. Further, the longitudinal stretch ratio was set to 3.6 times and the lateral stretch ratio was set to 3.9 times. Other conditions and the apparatus were the same as in Example 7. The thickness of the film obtained was 25 µm. The result obtained is shown in Table 3.

Comparative Example 3

In Comparative Example 1, the conditions and apparatus were the same as in Comparative Example 1 except that polyethylene naphthalate (PEN) added with 0.04 wt % of a coagulated silica particle having an intrinsic viscosity of 0.9 was used as the resin A, and polymethylene methacrylate (PMMA) was used as the resin B. The thickness of the film obtained was 100 µm. The result obtained is shown in Table 3.

Comparative Example 4

In Example 2, the shape of each fine slit in the feed block was adjusted so that a reflection band existed in 400 nm to 700 nm and the layer-pair thickness in a thinner side was set relatively more in the same manner as in Example 2. The thickness of the film obtained was 70 µm. Other conditions and the apparatus were the same as in Example 2. The result obtained is shown in Table 3.

Example 12

1. Production of Conductive Pattered Layer 1 and Circuit Substrate 1

On one surface of a black PET film (50 µm, Lumirror X30 manufactured by Toray Industries Inc.), a loop antenna pattern was printed by a screen printing (200 mesh nylon cloth) using a silver-based conductive ink, SS Riophase AG-A manufactured by Toyo Ink Mgf. Co., Ltd., and then, dried in an atmosphere at a temperature of 80° C. for 30 minutes to produce a loop antenna circuit (conductive pattered layer 2). Next, on terminals at both ends of the loop antenna, an anisotropic conductive film (ACF manufactured by Sony Chemical Corporation) was bonded, on which a bare chip (MIFARE chip manufactured by Siemens AG) was bonded by pressurization while heating, and bumps were connected to the loop antenna electrically to give a circuit substrate 1.

2. Production of Circuit-Mounted Sheet 1 and Noncontact IC Card 1

The laminated film described in Example 1, an adhesive layer (Aronmelt manufactured by Toa Gosei Co., Ltd.), the circuit substrate 1 (the circuit side is the white PET film side) and a white PET film (188 µm, Lumirror E20 manufactured by Toray Industries Inc.) were piled together in this order, and heat-sealed in the conditions at a temperature of 150° C. and a pressure of 10 Kg/cm$^2$ using a hot press, then cooled, thereby to produce a circuit-mounted sheet 1 having a thickness of 700 µm and having a glossy metallic appearance. Next, the circuit-mounted sheet 1 was punched out into a card shape to obtain a noncontact IC card 1. This noncontact IC card 1 was capable of transmitting and receiving while having a glossy metallic appearance.

TABLE 1

|  |  | Example 1 | Example 2 | Example 3 | Example 4 | Example 5 |
|---|---|---|---|---|---|---|
| Resin A | Composition | PET | PET | PET | PET | PET |
|  | SP value | 10.8 | 10.8 | 10.8 | 10.8 | 10.8 |
|  | Glass transition temperature (° C.) | 80 | 80 | 80 | 80 | 80 |
| Resin B | Composition | PE/SPG•T/CHDC | PE/CHDM•T | PE/CHDM•T | PE/CHDM•T | PE/CHDM•T |
|  | SP value | 10.2 | 10.4 | 10.4 | 10.4 | 10.4 |
|  | Glass transition temperature (° C.) | 81 | 80 | 80 | 80 | 80 |
| Number of layers of A layer |  | 401 | 401 | 401 | 401 | 401 |
| Number of layers of B layer |  | 400 | 400 | 400 | 400 | 400 |
| Minimum value of relative reflectance in wavelength range of 400 nm to 1200 nm (%) |  | 85 | 50 | 51 | 50 | 49 |
| Wavelength range with relative reflectance of 30% or more (nm) |  | 380-1290 | 390-1250 | 390-1250 | 390-1250 | 390-1250 |
| Tensile stress at 100% elongation in longitudinal direction/width direction (MPa) |  | 50/55 | 45/47 | 60/64 | 45/46 | 45/47 |
| Number of layer-pairs with layer-pair thickness of 10 nm or more and less than 220 nm |  | 220 | 220 | 220 | 220 | 156 |

TABLE 1-continued

|  | Example 1 | Example 2 | Example 3 | Example 4 | Example 5 |
|---|---|---|---|---|---|
| Number of layer-pairs with layer-pair thickness of 120 nm or more and less than 220 nm | 215 | 216 | 217 | 216 | 154 |
| Number of layer-pairs with layer-pair thickness of 220 nm or more and 320 nm or less | 130 | 132 | 131 | 131 | 150 |
| Average transmittance in wavelength range of 400 nm to 1000 nm (%) | 10 | 50 | 50 | 50 | 47 |
| Dynamic friction coefficient | 0.4 | 0.4 | 0.4 | 0.6 | 0.4 |
| Minimum value of relative reflectance of stretched part in wavelength range of 400 nm to 700 nm (%) | 84 | 49 | 49 | 49 | 48 |
| Glossiness | 831 | 655 | 663 | 659 | 620 |
| Formability | ● | ● | ○ | ○ | ● |
| Delamination | ● | ● | ● | ● | ● |
| Saturation (C*) | 3 | 4 | 4 | 4 | 6 |
| Attenuation rate at 800 MHz (dB) | 0.6 | 0.6 | 0.6 | 0.6 | 0.6 |
| Appearance | ● | ● | ● | ● | ○ |

TABLE 2

|  |  | Example 6 | Example 7 | Example 8 | Example 9 | Example 10 |
|---|---|---|---|---|---|---|
| Resin A | Composition | PET | PET | PET | PET | PET |
|  | SP value | 10.8 | 10.8 | 10.8 | 10.8 | 10.8 |
|  | Glass transition temperature (° C.) | 80 | 80 | 80 | 80 | 80 |
| Resin B | Composition | PE/SPG•T/CHDC | PE/SPG•T/CHDC | PE/SPG•T/CHDC | PE/SPG•T/CHDC | PE/SPG•T/CHDC |
|  | SP value | 10.2 | 10.2 | 10.2 | 10.2 | 10.2 |
|  | Glass transition temperature (° C.) | 81 | 81 | 81 | 81 | 81 |
| Number of layers of A layer |  | 201 | 101 | 401 | 401 | 401 |
| Number of layers of B layer |  | 200 | 100 | 400 | 400 | 400 |
| Minimum value of relative reflectance in wavelength range of 400 nm to 1200 nm (%) |  | 45 | 31 | 85 | 85 | 63 |
| Wavelength range with relative reflectance of 30% or more (nm) |  | 360-1240 | 390-1200 | 380-1290 | 380-1290 | 380-1460 |
| Tensile stress at 100% elongation in longitudinal direction/width direction (MPa) |  | 59/62 | 63/65 | 70/75 | 50/55 | 50/56 |
| Number of layer-pairs with layer-pair thickness of 10 nm or more and less than 220 nm |  | 120 | 56 | 220 | 156 | 160 |
| Number of layer-pairs with layer-pair thickness of 120 nm or more and less than 220 nm |  | 110 | 54 | 215 | 154 | 150 |
| Number of layer-pairs with layer-pair thickness of 220 nm or more and 320 nm or less |  | 55 | 31 | 130 | 150 | 105 |
| Average transmittance in wavelength range of 400 nm to 1000 nm (%) |  | 49 | 69 | 10 | 10 | 31 |
| Dynamic friction coefficient |  | 0.4 | 0.4 | 0.4 | 0.4 | 0.4 |
| Minimum value of relative reflectance of stretched part in wavelength range of 400 nm to 700 nm (%) |  | 45 | 32 | 84 | 84 | 60 |
| Glossiness |  | 623 | 414 | 833 | 807 | 834 |
| Formability |  | ● | ○ | ○ | ● | ● |
| Delamination |  | ● | ● | ● | ● | ● |
| Saturation (C*) |  | 4 | 6 | 3 | 5 | 2 |
| Attenuation rate at 800 MHz (dB) |  | 0.6 | 0.6 | 0.6 | 0.6 | 0.6 |
| Appearance |  | ● | ○ | ● | ○ | ● |

TABLE 3

|  |  | Example 11 | Comparative Example 1 | Comparative Example 2 | Comparative Example 3 | Comparative Example 4 |
|---|---|---|---|---|---|---|
| Resin A | Composition | PET | PET | PET | PEN | PET |
|  | SP value | 10.8 | 10.8 | 10.8 | 11.6 | 10.8 |
|  | Glass transition temperature (° C.) | 80 | 80 | 80 | 120 | 80 |

TABLE 3-continued

|  |  | Example 11 | Comparative Example 1 | Comparative Example 2 | Comparative Example 3 | Comparative Example 4 |
|---|---|---|---|---|---|---|
| Resin B | Composition | PE/SPG•T/CHDC | PE/SPG•T/CHDC | PE/SPG•T/CHDC | PMMA | PE/CHDM•T |
|  | SP value | 10.2 | 10.2 | 10.2 | 9.5 | 10.4 |
|  | Glass transition temperature (° C.) | 81 | 81 | 81 | 105 | 80 |
| Number of layers of A layer |  | 503 | 401 | 101 | 401 | 401 |
| Number of layers of B layer |  | 502 | 400 | 100 | 400 | 400 |
| Minimum value of relative reflectance in wavelength range of 400 nm to 1200 nm (%) |  | 118 | 86 | 32 | 120 | 79 |
| Wavelength range with relative reflectance of 30% or more (nm) |  | 380-1091 | 380-1290 | 390-1200 | 380-1290 | 380-785 |
| Tensile stress at 100% elongation in longitudinal direction/width direction (MPa) |  | 50/55 | 50/55 | 109/116 | 60/70 | 45/50 |
| Number of layer-pairs with layer-pair thickness of 10 nm or more and less than 220 nm |  | 235 | 170 | 56 | 170 | 160 |
| Number of layer-pairs with layer-pair thickness of 120 nm or more and less than 220 nm |  | 225 | 165 | 54 | 166 | 157 |
| Number of layer-pairs with layer-pair thickness of 220 nm or more and 320 nm or less |  | 205 | 175 | 31 | 176 | 38 |
| Average transmittance in wavelength range of 400 nm to 1000 nm (%) |  | 3 | 10 | 67 | 1 | 57 |
| Dynamic friction coefficient |  | 0.4 | 0.4 | 0.4 | 0.4 | 0.4 |
| Minimum value of relative reflectance of stretched part in wavelength range of 400 nm to 700 nm (%) |  | 119 | 85 | 35 | 121 | 9 |
| Glossiness |  | 906 | 784 | 394 | 930 | 695 |
| Formability |  | ● | ● | x | x | ● |
| Delamination |  | ● | ● | ● | x | ● |
| Saturation (C*) |  | 2 | 10 | 6 | 3 | 6 |
| Attenuation rate at 800 MHz (dB) |  | 0.6 | 0.6 | 0.6 | 0.6 | 0.6 |
| Appearance |  | ● | x | ● | ● | x |

INDUSTRIAL APPLICABILITY

We provide a laminated film in which layers made from at least two kinds of resins are laminated, and a molded body made from the laminated film. Further specifically, we provide a laminated film suitable for a metal-effect decorative material.

What is claimed is:

1. A laminated film comprising a structure where each 200 layers or more of a layer composed of a resin A (A layer) and a layer composed of a resin B (B layer) are alternately laminated, wherein a relative reflectance in a wavelength range of 400 nm to 1000 nm is 30% or more, tensile stresses at 100% elongation in a longitudinal direction and a width direction of the film are 3 MPa or more and 90 MPa or less in a tensile test at 150° C., and the number of layers with a layer pair-thickness of 120 nm or more and less than 220 nm is 1.05 times or more to 2.5 times or less the number of layers with a layer-thickness of 220 nm or more and 320 nm or less.

2. The laminated film of claim 1, wherein the average transmittance in a wavelength range of 400 nm to 1000 nm is 4% or more and 55% or less.

3. The laminated film of claim 1, wherein the dynamic friction coefficient of the laminated film is 0.5 or less.

4. The laminated film of claim 1, wherein the relative reflectance of a region stretched 1.2 times or more and 2 times or less in a wavelength range of 400 nm to 700 nm is 30% or more.

5. The laminated film of claim 1, wherein the resin A is polyethylene terephthalate or polyethylene naphthalate, and the resin B is a polyester containing spiroglycol.

6. The laminated film of claim 1, wherein the resin A is polyethylene terephthalate or polyethylene naphthalate, and the resin B is a polyester containing spiroglycol and cyclohexanedicarboxylic acid.

7. A molded body comprising the laminated film of claim 1.

8. The molded body of claim 7, comprising a colored layer.

9. A wireless communication instrument comprising the molded body of claim 7.

10. A half mirror comprising the laminated film of claim 1.

11. A circuit-mounted sheet comprising at least the laminated film of claim 1 and a conductive pattern layer.

12. An IC card or an IC label comprising the circuit-mounted sheet of claim 11.

* * * * *